(12) United States Patent
Adachi et al.

(10) Patent No.: US 12,484,239 B2
(45) Date of Patent: Nov. 25, 2025

(54) SEMICONDUCTOR MODULE

(71) Applicant: Kabushiki Kaisha Toshiba, Tokyo (JP)

(72) Inventors: Kento Adachi, Tokyo (JP); Tatsunori Sakano, Tokyo (JP); Tomoaki Inokuchi, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 393 days.

(21) Appl. No.: 18/174,866

(22) Filed: Feb. 27, 2023

(65) Prior Publication Data

US 2024/0079480 A1 Mar. 7, 2024

(30) Foreign Application Priority Data

Sep. 7, 2022 (JP) ................... 2022-142257

(51) Int. Cl.
| | | |
|---|---|---|
| *H01L 21/82* | (2006.01) | |
| *H01L 23/00* | (2006.01) | |
| *H01L 25/07* | (2006.01) | |
| *H10D 8/00* | (2025.01) | |
| *H10D 12/00* | (2025.01) | |

(52) U.S. Cl.
CPC ........... *H10D 12/481* (2025.01); *H01L 24/32* (2013.01); *H01L 25/072* (2013.01); *H10D 8/00* (2025.01); *H01L 2224/32245* (2013.01)

(58) Field of Classification Search
CPC .......... H10D 12/481; H10D 8/00; H10D 1/47; H10D 62/393; H01L 24/32; H01L 25/072; H01L 2224/32245; H01L 23/3735; H01L 25/18; H01L 24/29; H01L 24/83

USPC .......................................... 257/140
See application file for complete search history.

(56) References Cited

U.S. PATENT DOCUMENTS

| | | | | |
|---|---|---|---|---|
| 8,063,440 B2* | 11/2011 | Yankoski | ............... | H01L 25/18 |
| | | | | 257/334 |
| 8,129,836 B2* | 3/2012 | Takano | ................. | H01L 25/115 |
| | | | | 257/691 |
| 9,646,912 B2* | 5/2017 | Ushijima | .............. | H01L 25/115 |
| 10,074,590 B1* | 9/2018 | Pavier | ..................... | H01L 24/48 |
| 10,276,681 B2* | 4/2019 | Bina | ..................... | H03K 17/687 |
| 10,305,411 B2* | 5/2019 | Hasegawa | ............... | H01L 24/49 |
| 10,396,016 B2* | 8/2019 | Mullenix | ............ | H01F 27/2847 |
| 10,515,872 B1* | 12/2019 | Li | ......................... | H10D 64/665 |
| 10,811,524 B2* | 10/2020 | Iwakaji | ................ | H10D 62/137 |
| 11,355,617 B2* | 6/2022 | Dutta | ................... | H10D 84/038 |

(Continued)

FOREIGN PATENT DOCUMENTS

| | | |
|---|---|---|
| EP | 3764533 A1 | 1/2021 |
| JP | 2015018943 A | 1/2015 |

(Continued)

*Primary Examiner* — Vu A Vu
(74) *Attorney, Agent, or Firm* — Maier & Maier, PLLC

(57) ABSTRACT

A semiconductor module according to an embodiment includes a first conductor, a second conductor, a third conductor, a fourth conductor, a plurality of conductive bonding materials, and a plurality of multi-gate semiconductor devices. The multi-gate semiconductor device includes a semiconductor layer, a collector electrode. The multi-gate semiconductor device includes an emitter electrode, a first gate electrode, and a second gate electrode bonded to the second to fourth conductors via conductive bonding materials.

8 Claims, 5 Drawing Sheets

(56) References Cited

U.S. PATENT DOCUMENTS

| | | | | |
|---|---|---|---|---|
| 11,721,617 B2* | 8/2023 | McPherson | ....... | H01L 23/49811 257/77 |
| 2013/0037853 A1* | 2/2013 | Onozawa | ............. | H10D 64/231 257/E29.198 |
| 2018/0204778 A1 | 7/2018 | Hasegawa et al. | | |
| 2020/0091326 A1 | 3/2020 | Iwakaji et al. | | |
| 2021/0091217 A1 | 3/2021 | Miyoshi et al. | | |
| 2023/0147438 A1* | 5/2023 | Satoh | ................... | H10D 64/514 327/109 |

FOREIGN PATENT DOCUMENTS

| | | | |
|---|---|---|---|
| JP | 2016046279 | A | 4/2016 |
| JP | 2018186302 | A | 11/2018 |
| JP | 2019-161720 | A | 9/2019 |
| JP | 2020047790 | A | 3/2020 |
| JP | 6820287 | B2 | 1/2021 |

* cited by examiner

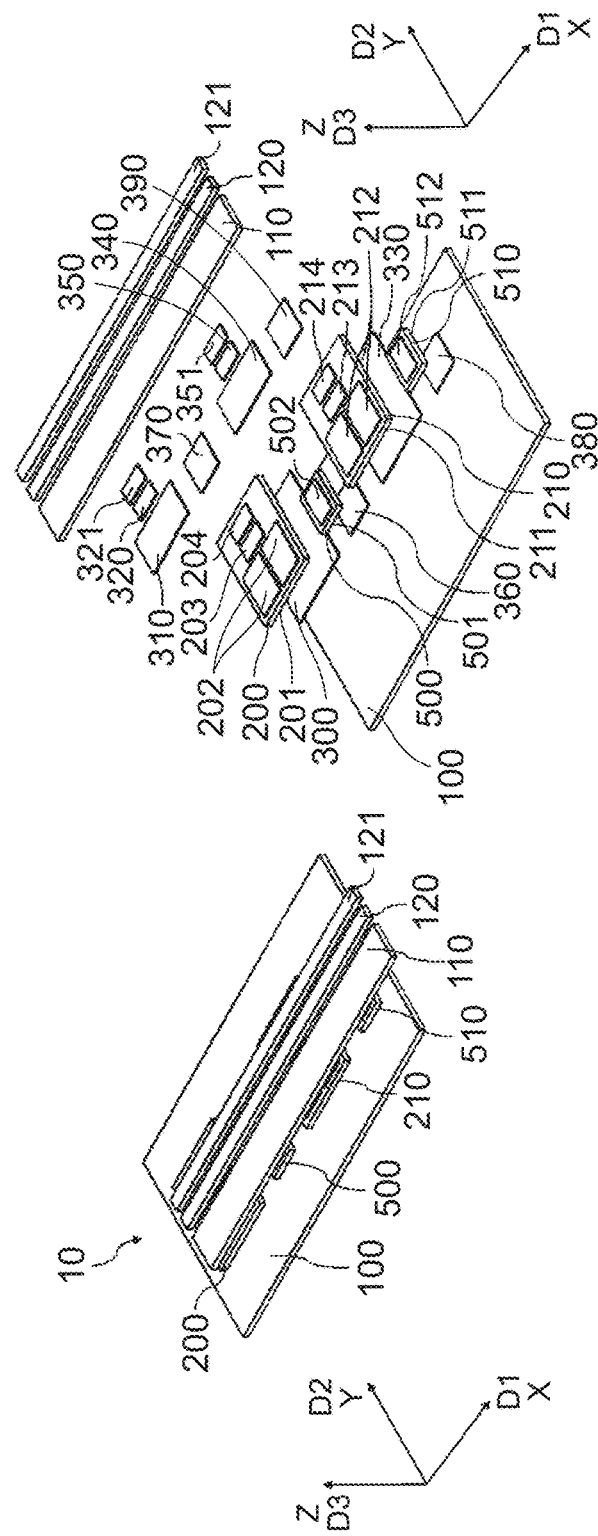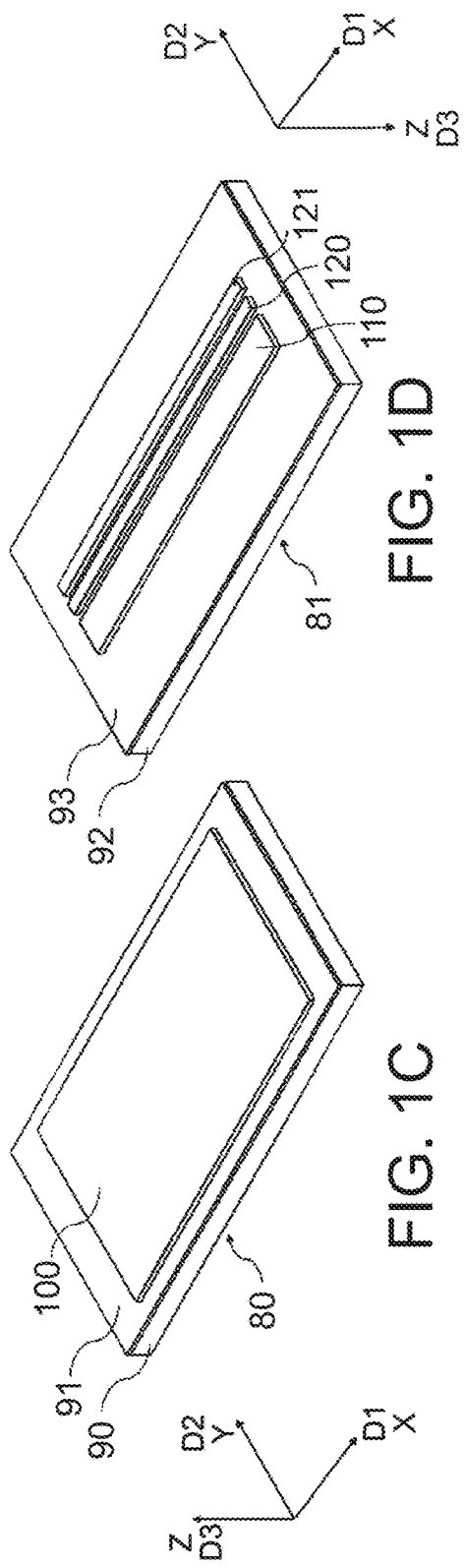

SEMICONDUCTOR MODULE

CROSS-REFERENCE TO RELATED APPLICATIONS

This application is based upon and claims the benefit of priority from Japanese Patent Application No. 2022-142257 filed on Sep. 7, 2022, and the entire contents of which are incorporated herein by reference.

FIELD

Embodiments described herein relate generally to a semiconductor module.

BACKGROUND

For example, a semiconductor device such as an insulated gate bipolar transistor (IGBT) is used for a power conversion circuit or the like.

A multi-gate IGBT can suppress loss of a semiconductor device.

However, it is desired to achieve both downsizing and a configuration in which a plurality of gate wirings do not interfere at the time of modularization.

There is a demand for a double-sided mounting type semiconductor module capable of reducing a parasitic inductance and improving a heat dissipation property and a mounting density in a semiconductor device.

BRIEF DESCRIPTION OF THE DRAWINGS

FIGS. 1A to 1D are schematic views illustrating a semiconductor module according to a first embodiment;

DETAILED DESCRIPTION

Figure 2A:
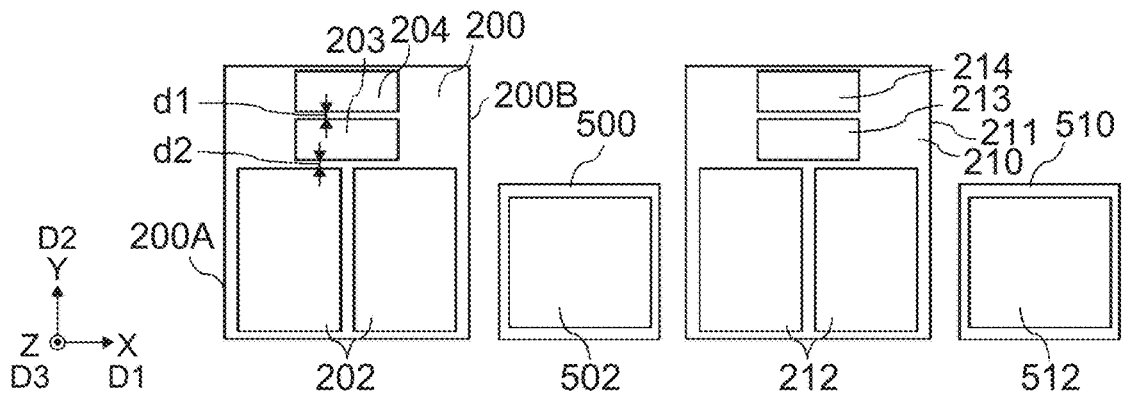
FIGS. 2A and 2B are schematic views illustrating a multi-gate IGBT, a diode, and a conductor included in the semiconductor module according to the first embodiment.

Hereinafter, embodiments will be described with reference to the drawings.

The drawings are schematic or conceptual, and a relationship between a thickness and a width of each portion, and a coefficient of a size ratio between portions, and the like are not necessarily the same as those in reality. The same portion may be illustrated with a different dimension or ratio depending on the drawings.

In the specification of the present application and the respective drawings, elements similar to those described before with respect to the previously described drawings are denoted by the same reference signs, and the detailed description thereof is appropriately omitted.

First Embodiment

FIG. 1 is a schematic diagram illustrating a semiconductor module according to a first embodiment. A semiconductor module 10 includes a plurality of semiconductor devices connected in parallel. The semiconductor device is a switching element that switches an electrical connection between two electrodes in accordance with an input of a gate electrode, and includes at least four types of electrodes. In the present specification, an example in which the semiconductor device is a semiconductor chip of a multi-gate IGBT having two types of gate electrodes will be described. FIG. 1A is a perspective view of the semiconductor module according to the first embodiment; FIG. 1B is an exploded perspective view of the semiconductor module according to the first embodiment; FIG. 1C is a perspective view of a first substrate on which the semiconductor module according to the first embodiment can be mounted; and FIG. 1D is a perspective view of a second substrate on which the semiconductor module according to the first embodiment can be mounted. In FIGS. 1A and 1B, a first substrate 80 and a second substrate 81 are omitted. FIG. 1D is drawn by reversing a Z direction.

As illustrated in FIG. 1, the semiconductor module 10 according to the embodiment includes a first conductor 100, a second conductor 110, a third conductor 120, a fourth conductor 121, multi-gate IGBTs 200 and 210, and metal bonding materials 300, 310, 320, 321, 330, 340, 350, and 351.

A direction from the multi-gate IGBT 200 toward the multi-gate IGBT 210 is defined as a first direction D1. The first direction D1 is defined as an X direction. A direction intersecting the first direction D1 is defined as a second direction D2. Further, a direction intersecting the first direction D1 and the second direction D2 is defined as a third direction D3. The second direction D2 is, for example, a Y direction, and a third direction D3 is, for example, the Z direction. The X direction, the Y direction, and the Z direction are independent of each other. The X direction, the Y direction, and the Z direction intersect perpendicularly to each other, for example.

The multi-gate IGBT 200 includes a collector electrode 201, an emitter electrode 202, a first gate electrode 203, and a second gate electrode 204. Further, the multi-gate IGBT 210 includes a collector electrode 211, an emitter electrode 212, a first gate electrode 213, and a second gate electrode 214. The multi-gate IGBTs 200 and 210 have the same electrode arrangement and the same type of semiconductor structure.

The multi-gate IGBTs 200 and 210 have a first plane and a second plane opposite to the first plane. The collector electrodes 201 and 211 are provided on the first plane. Since electrodes provided on the first plane are only the collector electrodes 201 and 211, the collector electrodes 201 and 211 can be enlarged, and heat generation in the multi-gate IGBTs 200 and 210 is suppressed. The emitter electrodes 202 and 212, the first gate electrodes 203 and 213, and the second gate electrodes 204 and 214 are provided on the second plane. The emitter electrodes 202 and 212, the first gate electrodes 203 and 213, and the second gate electrodes 204 and 214 provided on the second plane can be disposed at any positions of the multi-gate IGBTs 200 and 210, respectively, while being electrically independent from each other in a case of being wired by wire bonding or the like without being mounted using a metal bonding material. However, when the emitter electrodes 202 and 212, the first gate electrodes 203 and 213, and the second gate electrodes 204 and 214 provided on the second plane are mounted using a metal bonding material while causing the second conductor 110, the third conductor 120, and the fourth conductor 121 to be present at the same height, the arrangement of the emitter electrodes 202 and 212, the first gate electrodes 203 and 213, and the second gate electrodes 204 and 214 is limited.

The first and second gate electrodes are electrically independent of each other and can be controlled in an electrically and timingly independent manner.

The emitter electrode may be divided into a plurality of parts as in FIG. 1, or is not necessarily divided.

The semiconductor module 10 includes a plurality of multi-gate IGBTs including the multi-gate IGBTs 200 and 210. The multi-gate IGBT is a switching element having at least two types of gate electrodes provided on a common semiconductor substrate of semiconductor elements. The same type of electrodes of the plurality of multi-gate IGBTs are connected to each other by a metal bonding member. In FIG. 1, the number of parallel multi-gate IGBTs is two, but the present embodiment can be applied to any number of parallel multi-gate IGBTs of two or more.

The collector electrode 201, the metal bonding material 300, and the first conductor 100 overlap or stacked in order in the third direction D3 and are connected to each other. The collector electrode 211, the metal bonding material 330 and the first conductor 100 overlap in order and are connected to each other. The first conductor 100, the metal bonding material 300, and the collector electrode 201 overlap in order in the third direction D3 and are connected to each other. The first conductor 100, the metal bonding material 330, and the collector electric station 211 overlap in order in the third direction D3 and are connected to each other. The emitter electrode 202, the metal bonding material 310, and the second conductor 110 overlap in order in the third direction D3 and are connected to each other. The emitter electrode 212, the metal bonding material 340, and the second conductor 110 overlap in order in the third direction D3 and are connected to each other. The first gate electrode 203, the metal bonding material 320, and the third conductor 120 overlap in order in the third direction D3 and are connected to each other. The first gate electrode 213, the metal bonding material 350, and the third conductor 120 overlap in order in the third direction D3 and are connected to each other. The second gate electrode 204, the metal bonding material 321, and the fourth conductor 121 overlap in order in the third direction D3 and are connected to each other. The second gate electrode 214, the metal bonding material 351, and the fourth conductor 121 overlap in order in the third direction D3 and are connected to each other.

The first conductor 100 is a conductor extending in the first direction D1 and the second direction D2, and can be configured using, for example, a metal wiring of a direct bonded copper (DBC) substrate or a metal base substrate. At this time, the first conductor 100 may be a part of the first substrate 80. The first substrate 80 includes a base layer 90, an insulating layer 91, and the first conductor 100. The base layer 90 is a substrate on which the insulating layer 91 and the first conductor 100 are placed, spreads in the first direction D1 and the second direction, and can be made of, for example, copper or aluminum. The insulating layer 91 is provided between the base layer 90 and the first conductor 100 to insulate the base layer 90 from the first conductor 100, and can be made of, for example, resin or ceramic.

The second conductor 110, the third conductor 120, and the fourth conductor 121 are conductors extending in the first direction D1. The second conductor 110, the third conductor 120, and the fourth conductor 121 can also be configured using, for example, a metal wiring of a direct bonded copper (DBC) substrate or a metal base substrate. At this time, the second conductor 110, the third conductor 120, and the fourth conductor 121 may be a part of the second substrate 81. The second substrate 81 includes a base layer 92, an insulating layer 93, the second conductor 110, the third conductor 120, and the fourth conductor 121. The base layer 92 is a substrate on which the insulating layer 93, the second conductor 110, the third conductor 120, and the fourth conductor 121 are placed, spreads in the first direction D1 and the second direction D2, and can be made of, for example, copper or aluminum. The insulating layer 93 is provided between the base layer 92 and the second conductor 110, the third conductor 120, and the fourth conductor 121 to insulate the base layer 90 from the plurality of conductors, and can be made of, for example, resin or ceramic. The second conductor 110, the third conductor 120, and the fourth conductor 121 are wirings of the second substrate 81, and thus, are present at the same position in the third direction D3. In other words, the second conductor 110, the third conductor 120, and the fourth conductor 121 are equidistant from the base layer 92 and equidistant from the first conductor 100. In the third direction D3, the first conductor 100, the second conductor 110, the third conductor 121, the fourth conductor 121, and the plurality of multi-gate IGBTs are located between the first substrate 80 and the second substrate 81.

As the metal bonding materials 300, 310, 320, 321, 330, 340, 350, and 351, for example, a solder material or a sintered bonding material can be used. The metal bonding material is a conductive bonding material.

As illustrated in FIG. 1, the semiconductor module 10 may further include diodes 500 and 510. The diode 500 includes an anode electrode 502 and a cathode electrode 501. Further, the diode 510 includes an anode electrode 512 and a cathode electrode 511. Each of the diodes 500 and 510 extends in the first direction D1 and the second direction D2, and has a first plane and a second plane opposite to the first plane. The cathode electrodes 501 and 511 are provided on the first planes of the diodes 500 and 510, respectively. The anode electrodes 502 and 512 are provided on the second planes of the diodes 500 and 510, respectively. The anode electrode 502, the metal bonding material 370, and the second conductor 110 overlap in order in the third direction D3 and are connected to each other. The anode electrode 512, the metal bonding material 390, and the second conductor 110 overlap in order in the third direction D3 and are connected to each other. The cathode electrode 501, the metal bonding material 360, and the first conductor 100 overlap in order in the third direction D3 and are connected to each other. The cathode electrode 511, the metal bonding material 380, and the first conductor 100 overlap in order in the third direction D3 and are connected to each other. The diodes 500 and 510 are provided as necessary and may be omitted.

The semiconductor module 10 can drive the plurality of semiconductor devices with the same control signal by electrically connecting the same type of electrodes included in the plurality of semiconductor devices. The semiconductor module 10 can control larger current and power as compared with one semiconductor device.

Figure 2B:
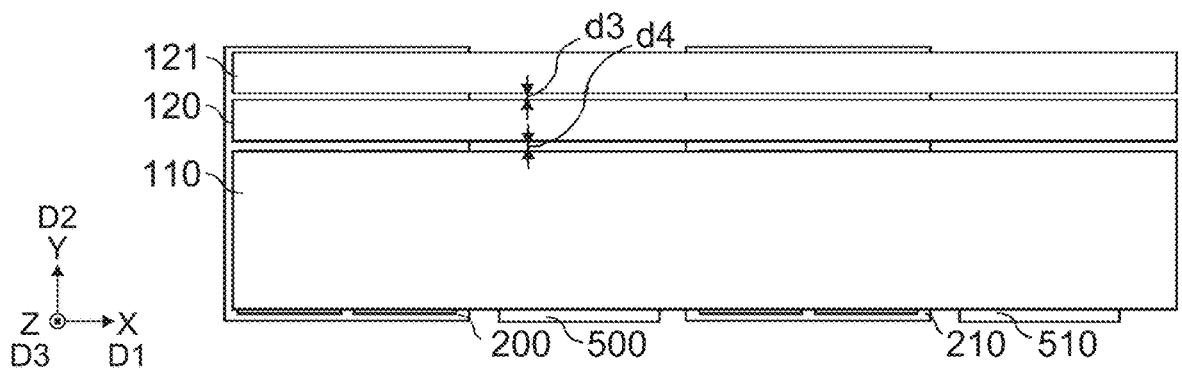

FIGS. 2A and 2B are schematic views illustrating a multi-gate IGBT, a diode, and a conductor included in the semiconductor module according to the first embodiment. FIG. 2A is a plan view illustrating the multi-gate IGBT and the diode according to the first embodiment, and FIG. 2B is a plan view illustrating a positional relationship between the multi-gate IGBT and the diode, and the conductor according to the first embodiment. The numerals 200 and 210 are multi-gate IGBTs, 200A is a left end of the multi-gate IGBT 200, and 200B is a right end of the multi-gate IGBT 200.

In the embodiment, the first gate electrode 203 and the second gate electrode 204 are arranged at an interval in the second direction D2. The first gate electrode 203, the second gate electrode 204, and the emitter electrode 202 are arranged at intervals in the second direction D2. Further, the first gate electrode 213 and the second gate electrode 214 are also disposed at an interval in the second direction D2. The first gate electrode 213, the second gate electrode 214, and the emitter electrode 212 are arranged at intervals in the second direction D2. As a result, the second conductor 110, the third conductor 120, and the fourth conductor 121 are spaced apart in the second direction D2 and electrically separated while being present at the same position in the third direction D3.

Since the second conductor 110, the third conductor 120, and the fourth conductor 121 can be electrically separated while being present at the same position in the third direction D3 without changing dimensions in the third direction D3, a size of the semiconductor module 10 in the third direction D3 can be reduced. In other words, the second conductor 110, the third conductor 120, and the fourth conductor 121 do not three-dimensionally intersect each other in the third direction D3, but are connected to the same type of electrode groups of the plurality of semiconductor devices arrayed in a predetermined direction. In the semiconductor module 10, an area of a circuit loop is reduced, and a parasitic inductance is reduced. Further, the semiconductor device included in the semiconductor module 10 has a shape extending in the first direction D1 and the second direction D2, and thus, heat is dissipated from both ends in the third direction D3. Therefore, since a size of the semiconductor module 10 in the third direction D3 is small, thermal resistance is reduced, and a heat dissipation property is improved. Furthermore, since the size in the third direction D3 is small, a size of the entire semiconductor module 10 is reduced, and a mounting density is improved.

Figure 9:
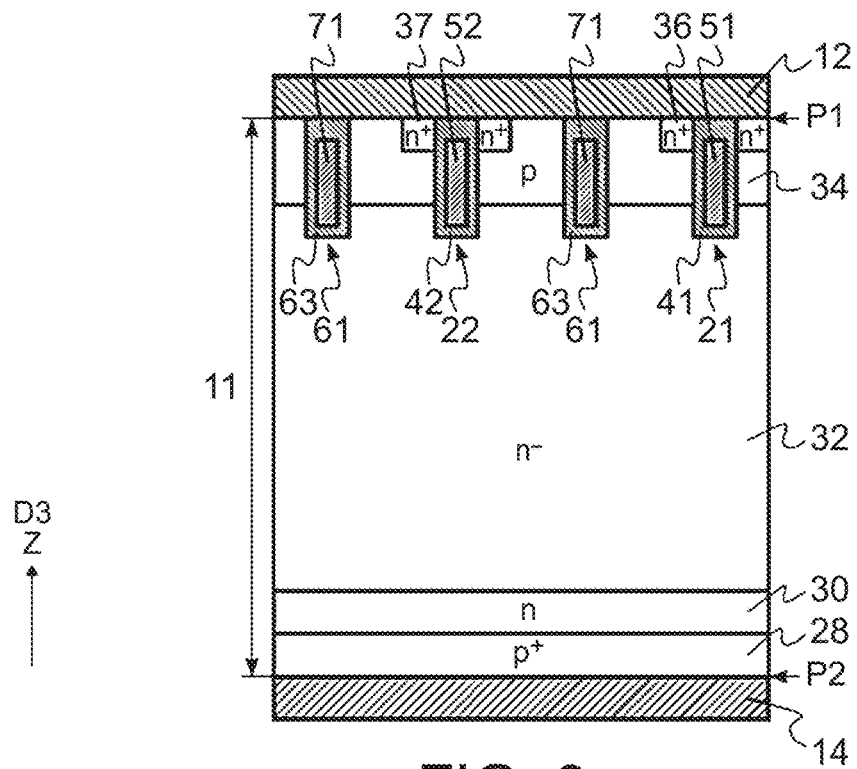
FIG. 9 is a cross-sectional view illustrating an example of a configuration of a multi-gate IGBT.

An example of a configuration of a multi-gate IGBT will be described with reference to FIG. 9 as an example. FIG. 9 is a cross-sectional view illustrating an example of the configuration the multi-gate IGBT. Hereinafter, an example in which two systems of IGBTs controlled by two systems of gates are formed in one chip will be described. As long as at least one system of the gate operates as the IGBT or simply as a switch, the other system may be a switching diode or have another configuration. Electrodes in a trench are connected to various conductors, but are not illustrated here.

The semiconductor layer 11 includes a first gate trench 21, a second gate trench 22, a first gate electrode 51 (first gate conductor), a second gate electrode 52 (second gate conductor), a p-type collector region 28, an n-type buffer region 30, an n-type drift region 32, a p-type base region 34, a first n-type emitter region 36, a second n-type emitter region 37, a first gate insulating film 41, a second gate insulating film 42, a resistor trench 61, a first resistor layer 71, and an insulating film 63.

The semiconductor layer 11 has a first plane P1 and a second plane P2 opposing the first plane P1. The semiconductor layer 11 is, for example, single crystal silicon.

The emitter electrode 12 is provided on the first plane P1 side of the semiconductor layer 11. The emitter electrode 12 covers the entire surface of an IGBT cell region, for example. At least a part of the emitter electrode 12 is in contact with the first plane P1 of the semiconductor layer 11. The emitter electrode 12 is, for example, metal. An emitter voltage is applied to the emitter electrode 12. The emitter voltage is, for example, 0 V.

The collector electrode 14 is provided on the second plane P2 side of the semiconductor layer 11. At least a part of the collector electrode 14 is in contact with the second plane P2 of the semiconductor layer 11. The collector electrode 14 is, for example, metal. A collector voltage is applied to the collector electrode 14. The collector voltage is, for example, 200 V or more and 6500 V or less.

The p-type collector region 28 is a p+ semiconductor region. The p-type collector region 28 is electrically connected to the collector electrode 14. The p-type collector region 28 is in contact with the collector electrode 14.

The p-type collector region 28 serves as a hole supply source in an on state of the IGBT 200.

The n-type buffer region 30 is an n-type semiconductor region. The n-type buffer region 30 is provided between the first plane P1 and the p-type collector region 28. The n-type buffer region 30 has a function of suppressing the spread of a depletion layer in an off state of the IGBT 200. It is also possible to adopt a configuration in which the n-type buffer region 30 is not provided.

The n-type drift region 32 is an n− semiconductor region. The n-type drift region 32 is provided between the first plane P1 and the n-type buffer region 30. An n-type impurity concentration of the n-type drift region 32 is lower than an n-type impurity concentration of the n-type buffer region 30.

The n-type drift region 32 serves as a path of an on-current in the on state of the IGBT 200. The n-type drift region 32 has a function of being depleted in the off state of the IGBT 200 to maintain a breakdown voltage of the IGBT 200.

The p-type base region 34 is a p-type semiconductor region. The p-type base region 34 is provided between the first plane P1 and the n-type drift region 32. A depth of the p-type base region 34 in a direction from the first plane P1 toward the second plane P2 is, for example, 6 μm or less. In the p-type base region 34, an inversion layer is formed in the on state of the IGBT 200 and functions as a channel region of a transistor.

Incidentally, an n-type barrier layer (not illustrated) may be provided between the n-type drift region 32 and the p-type base region 34. An n-type impurity concentration of the n-type barrier layer is higher than the n-type impurity concentration of the n-type drift region 32. The n-type barrier layer is provided on a side closer to the p-type base region 34 than a lower end of the first gate trench 21. In other words, the n-type barrier layer is shallower than the lower end of the first gate trench 21.

The first n-type emitter region 36 is an n+ semiconductor region. The first n-type emitter region 36 is provided between the first plane P1 and the p-type base region 34. An n-type impurity concentration of the first n-type emitter region 36 is higher than the n-type impurity concentration of the n-type drift region 32.

The first n-type emitter region 36 is electrically connected to the emitter electrode 12. The first n-type emitter region 36 is in contact with the emitter electrode 12. The first n-type emitter region 36 serves as an electron supply source in an on state of a transistor having the first gate electrode 51.

The second n-type emitter region 37 is an n+ semiconductor region. The second n-type emitter region 37 is provided between the first plane P1 and the p-type base region 34. An n-type impurity concentration of the second n-type emitter region 37 is higher than the n-type impurity concentration of the n-type drift region 32.

The second n-type emitter region 37 is electrically connected to the emitter electrode 12. The second n-type emitter region 37 is in contact with the emitter electrode 12. The second n-type emitter region 37 serves as an electron supply source in an on state of a transistor having the second gate electrode 52.

The first gate trench 21 is provided in the IGBT cell region. The first gate trench 21 extends in the first direction parallel to the first plane P1 on the first plane P1. The first gate trench 21 has a stripe shape. A plurality of the first gate trenches 21 are repeatedly arranged in the second direction orthogonal to the first direction.

The first gate trench 21 penetrates through the first n-type emitter region 36 and the p-type base region 34. A depth of the first gate trench 21 is, for example, 6 μm or less.

The first gate electrode 51 is provided in the first gate trench 21. The first gate electrode 51 is, for example, a semiconductor or metal. The first gate electrode 51 is, for example, amorphous silicon or polycrystalline silicon containing n-type impurities or p-type impurities. The first gate insulating film 41 is provided between the first gate electrode 51 and the p-type base region 34. The first gate insulating film 41 is, for example, a silicon oxide film.

The second gate trench 22 is provided in the IGBT cell region. The second gate trench 22 extends in the first direction parallel to the first plane P1 on the first plane P1. The second gate trench 22 has a stripe shape. A plurality of the second gate trench 22 is repeatedly arranged in the second direction orthogonal to the first direction.

The second gate trench 22 penetrates through the p-type base region 34. A depth of the second gate trench 22 is, for example, 4 μm or more and 6 μm or less.

The second gate trench 22 has, for example, the same shape as the first gate trench 21.

The second gate electrode 52 is provided in the second gate trench 22. The second gate electrode 52 is, for example, a semiconductor or metal. The second gate electrode 52 is, for example, amorphous silicon or polycrystalline silicon containing n-type impurities or p-type impurities. The second gate electrode 52 is electrically connected to the gate electrode pad.

The second gate insulating film 42 is provided between the second gate electrode 52 and the p-type base region 34. The second gate insulating film 42 is, for example, a silicon oxide film.

The resistor trench 61 is provided in the IGBT cell region. The resistor trench 61 is provided between the first gate trench 21 and the second gate trench 22. The resistor trench 61 extends in the first direction parallel to the first plane P1 on the first plane P1. The resistor trench 61 has a stripe shape. The resistor trenches 61 are repeatedly arranged in the second direction orthogonal to the first direction.

The resistor trench 61 penetrates through the p-type base region 34. A depth of the resistor trench 61 is, for example, 6 μm or less.

The resistor trench 61 has, for example, the same shape as the first gate trench 21 and the second gate trench 22.

The first resistor layer 71 is provided in the resistor trench 61. The first resistor layer 71 is, for example, a semiconductor or metal. The first resistor layer 71 is, for example, amorphous silicon or polycrystalline silicon containing n-type impurities or p-type impurities. The first resistor layer 71 is electrically connected to the gate electrode.

An electrical resistivity of the first resistor layer 71 is higher than, for example, an electrical resistivity of the first gate electrode 51 and an electrical resistivity of the second gate electrode 52. For example, the first resistor layer 71, the first gate electrode 51, and the second gate electrode 52 are amorphous silicon or polycrystalline silicon containing n-type impurities or p-type impurities. Then, for example, a conductive impurity concentration of the first resistor layer 71 is lower than a conductive impurity concentration of the first gate electrode 51 and a conductive impurity concentration of the second gate electrode 52.

The insulating film 63 is provided between the first resistor layer 71 and the p-type base region 34. The insulating film 63 is, for example, a silicon oxide film.

Next, the operation of the multi-gate IGBT 200 will be described.

Although the transistor having the first gate electrode 51 and the transistor having the second gate electrode 52 are not structures that are clearly separated, the transistor having the first gate electrode 51 and the transistor having the second gate electrode 52 are described for convenience in describing the operation.

In the off state of the IGBT 200, for example, the emitter voltage is applied to the emitter electrode 12. The emitter voltage is, for example, 0 V. A collector voltage is applied to the collector electrode 14. The collector voltage is, for example, 200 V or more and 6500 V or less.

In the off state of the IGBT 200, a turn-off voltage is applied to the gate electrode pad. Therefore, the turn-off voltage is also applied to the first gate electrode 51 and the second gate electrode 52. The turn-off voltage is a voltage equal to or lower than a threshold at which the transistor in the cell region is not turned on, and is, for example, 0 V.

When the IGBT 200 is turned on, a turn-on voltage is applied to the gate electrode pad. A turn-on voltage is also applied to the first gate electrode 51 and the second gate electrode 52.

The turn-on voltage is a voltage exceeding the threshold voltage of the transistor in the cell region. The turn-on voltage is, for example, 15 V. Both the transistor having the first gate electrode 51 and the transistor having the second gate electrode 52 in the cell region are turned on.

When the IGBT 200 is turned off, the turn-off voltage is applied to the gate electrode pad. At this time, the first resistor layer 71 is connected to the gate electrode pad, and thus, the first gate electrode 51 has a higher gate resistance than the second gate electrode 52. Therefore, a change in a potential of the first gate electrode 51 is delayed relative to the second gate electrode 52. Thus, the transistor having the second gate electrode 52 is turned off prior to the transistor having the first gate electrode 51.

When the transistor having the second gate electrode 52 is turned off, the number of electrons injected from the emitter electrode 12 side into the n-type drift region 32 decreases. Therefore, the number of carriers accumulated in the n-type drift region 32 decreases.

Thereafter, the delayed transistor having the first gate electrode 51 is also turned off, and the IGBT 200 is turned off. At this time, since the number of carriers accumulated in the n-type drift region 32 has already decreased, the turn-off time is shortened, and switching loss is suppressed.

Figure 8A:
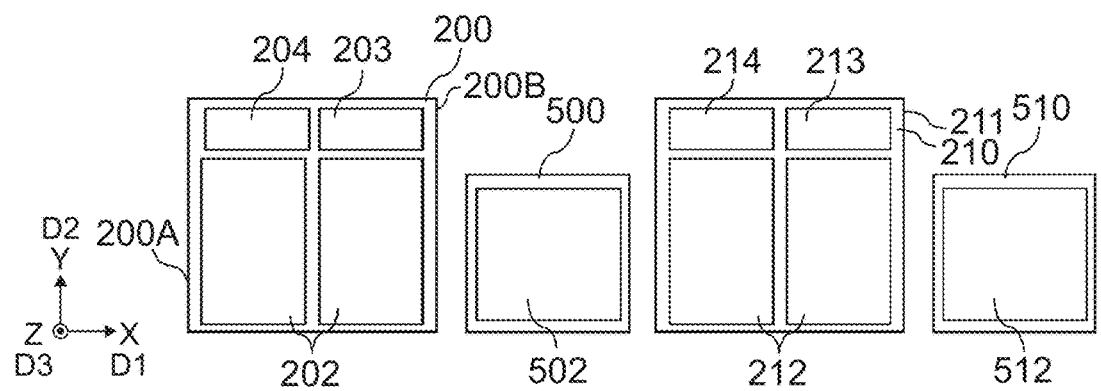
FIGS. 8A and 8B are schematic views illustrating a multi-gate IGBT, a diode, and a conductor included in a semiconductor module according to a reference example.
Figure 8B:
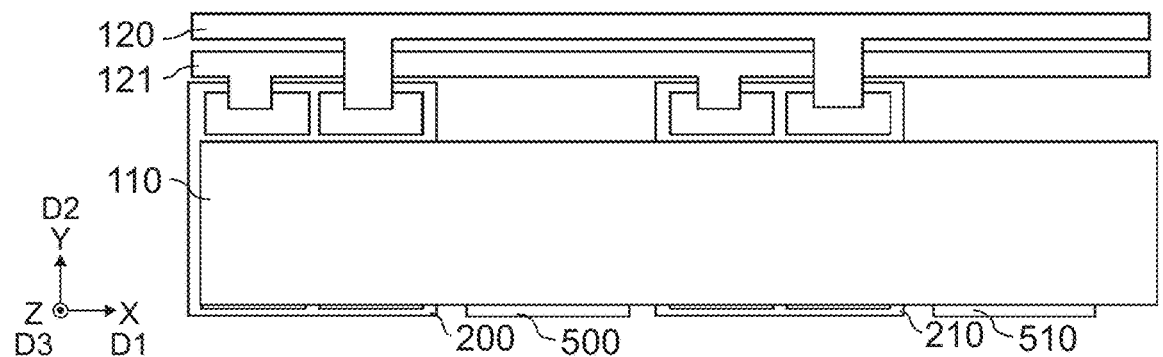

FIG. 8 is a schematic view illustrating a multi-gate IGBT, a diode, and a conductor included in a semiconductor module according to a reference example. FIG. 8A is a plan view illustrating the multi-gate IGBT and the diode according to the reference example, and FIG. 8B is a plan view illustrating a positional relationship between the multi-gate IGBT and the diode, and the conductor according to the reference example. In the reference example, an electrode of the multi-gate IGBT is provided with a large emitter electrode on which heat is concentrated as illustrated in FIG. 8A. The first gate electrode 203 and the second gate electrode 204 are arranged to be spaced apart from the emitter electrode 202 in the second direction D2. The first gate electrode 203 and the second gate electrode 204 are arranged at an interval in the first direction D1. The first gate electrode 213 and the second gate electrode 214 are arranged to be spaced apart from the emitter electrode 212 in the second direction D2. The first gate electrode 213 and the second gate electrode 214 are disposed at an interval in the first direction D1.

In a first reference example illustrated in FIG. 8B, it is difficult to electrically separate all of the third conductor 120 electrically connecting the first gate electrode 203 of the multi-gate IGBT 200 and the first gate electrode 213 of the multi-gate IGBT 210, the fourth conductor 121 electrically connecting the second gate electrode 204 of the multi-gate IGBT 200 and the second gate electrode 214 of the multi-gate IGBT 210, and the second conductor 110. In the embodiment, the third conductor 120 electrically connecting the first gate electrode 203 of the multi-gate IGBT 200 and the first gate electrode 213 of the multi-gate IGBT 210, the fourth conductor 121 electrically connecting the second gate electrode 204 of the multi-gate IGBT 200 and the second gate electrode 214 of the multi-gate IGBT 210, and the second conductor 110 can be electrically separated.

For example, in a second reference example, the first gate electrodes 203 and 213 and the second gate electrodes 204 and 214 can be wired while being electrically separated by using wire bonding.

However, a space of, for example, 1 mm or more in the D3 direction is required between each of the emitter electrodes 202 and 212 and the second conductor 110 since the first gate electrodes 203 and 213 and the second gate electrodes 204 and 214 are subjected to the wire bonding. The space can be secured by inserting a metal block of 1 mm or more between each of the emitter electrodes 202 and 212 and the second conductor 110, changing the metal bonding materials 310 and 340 to those having a thickness of 1 mm or more, or the like. For example, a solder ball having a diameter of 1 mm or more or solder containing a metal core ball is used as the metal bonding material, and copper, for example, is used as metal of the solder containing the metal core ball. However, a parasitic inductance, a size, and thermal resistance are expected to increase since the space of 1 mm or more is inserted between each of the emitter electrodes 202 and 212 and the second conductor 110. In the embodiment, the third conductor 120 electrically connecting the first gate electrode 203 of the multi-gate IGBT 200 and the first gate electrode 213 of the multi-gate IGBT 210, the fourth conductor 121 electrically connecting the second gate electrode 204 of the multi-gate IGBT 200 and the second gate electrode 214 of the multi-gate IGBT 210 are electrically separated while being present at the same height as the second conductor 110, the parasitic inductance, the size, and the thermal resistance are reduced as compared with the second reference example.

A distance between the first gate electrode 203 and the second gate electrode 204 of the multi-gate IGBT 200 is defined as a first distance d1. The first distance d1 is preferably, for example, 50 μm or more and 500 μm or less. When the first distance d1 is 50 μm or more, for example, a breakdown voltage between the first gate electrode 203 and the second gate electrode 204 can be easily secured. When the first distance d1 is 500 μm or less, for example, the multi-gate IGBT 200 can be easily downsized.

A distance between the first gate electrode 203 and the emitter electrode 202 of the multi-gate IGBT 200 is defined as a second distance d2. The second distance d2 is preferably, for example, 50 μm or more and 500 μm or less. When the second distance d2 is 50 μm or more, for example, a breakdown voltage between the first gate electrode 203 and the emitter electrode 202 can be easily secured. When the second distance d2 is 500 μm or less, for example, the multi-gate IGBT 200 can be easily downsized.

A distance between the third conductor 120 and the fourth conductor 121 is defined as a third distance d3. The third distance d3 is preferably, for example, 50 μm or more and 1000 μm or less. When the third distance d3 is 50 μm or more, for example, a breakdown voltage between the third conductor 120 and the fourth conductor 121 can be easily secured.

A distance between the third conductor 120 and the second conductor 110 is defined as a fourth distance d4. The fourth distance d4 is preferably, for example, 50 μm or more and 1000 μm or less. When the fourth distance d4 is 50 μm or more, for example, a breakdown voltage between the third conductor 120 and the second conductor 110 can be easily secured.

Second Embodiment

Figure 3A:
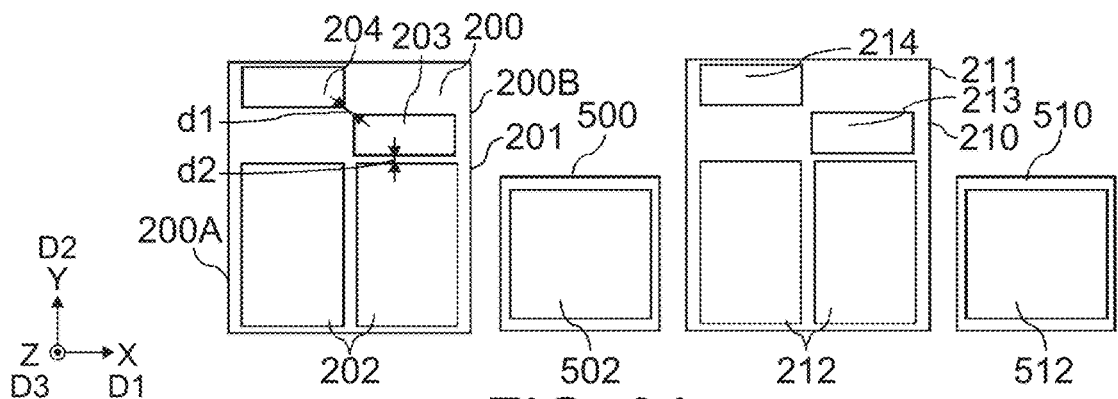
FIGS. 3A and 3B are schematic views illustrating a multi-gate IGBT, a diode, and a conductor included in a semiconductor module according to a second embodiment.
Figure 3B:
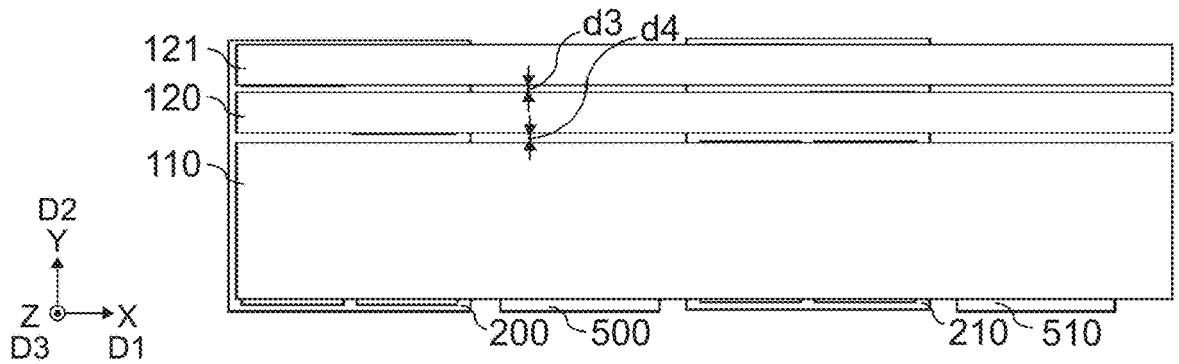

A second embodiment relates to an electrode arrangement of a multi-gate IGBT and a method for connecting the multi-gate IGBT and a conductor. FIGS. 3A and 3B are schematic views illustrating a multi-gate IGBT, a diode, and a conductor included in a semiconductor module according to the first embodiment. FIG. 3A is a plan view illustrating the multi-gate IGBT and the diode according to the second embodiment, and FIG. 3B is a plan view illustrating a positional relationship between the multi-gate IGBT and the diode, and the conductor according to the second embodiment.

As illustrated in FIG. 3A, the second embodiment is different from the first embodiment in that positions of the first gate electrodes 203 and 213 and the second gate electrodes 204 and 214 are displaced in the first direction D1. The first gate electrodes 203 and 213 and the second gate electrodes 204 and 214 do not overlap each other in the first direction and are separated from each other. Even when the gate electrodes are displaced in the first direction D1 in this manner, the second conductor 110, the third conductor 120, and the fourth conductor 121 are electrically separated while being present at the same height as illustrated in FIG. 3B.

Third Embodiment

Figure 4A:
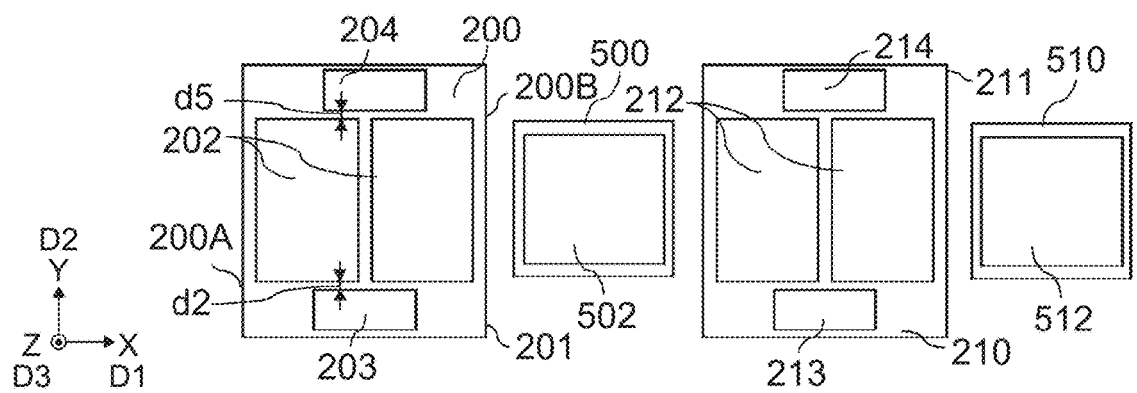
FIGS. 4A and 4B are schematic views illustrating a multi-gate IGBT, a diode, and a conductor included in a semiconductor module according to a third embodiment.
Figure 4B:
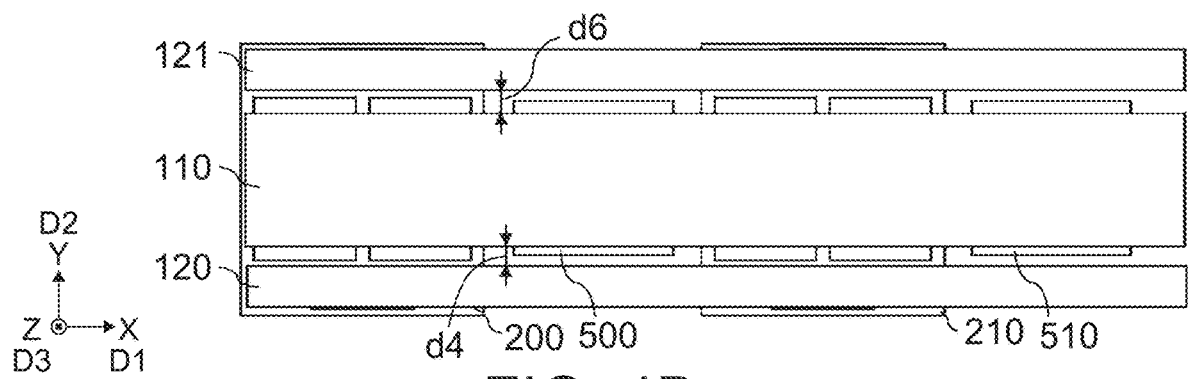

A third embodiment relates to an electrode arrangement of a multi-gate IGBT and a method for connecting the multi-gate IGBT and a conductor. FIGS. 4A and 4B are schematic views illustrating a multi-gate IGBT, a diode, and a conductor included in a semiconductor module according to the first embodiment. FIG. 4A is a plan view illustrating the multi-gate IGBT and the diode according to the third embodiment, and FIG. 4B is a plan view illustrating a positional relationship between the multi-gate IGBT and the diode, and the conductor according to the third embodiment.

As illustrated in FIG. 4A, in the third embodiment, an emitter electrode is located between the first gate electrode 203 and the second gate electrode 204 of the multi-gate IGBT 200 in the second direction D2. Further, the emitter electrode is located between the first gate electrode 213 and the second gate electrode 214 of the multi-gate IGBT 210 in the second direction D2. In such a case as well, the second conductor 110, the third conductor 120, and the fourth conductor 121 are electrically separated while being present at the same height as illustrated in FIG. 4B.

Further, the first gate electrode 203 and the second gate electrode 204 of the multi-gate IGBT 200 may be displaced in the first direction D1 as in the second embodiment, and the first gate electrode 213 and the second gate electrode 214 of the multi-gate IGBT 210 may also be displaced in the first direction D1 as in the second embodiment.

A distance between the second gate electrode 204 and the emitter electrode 202 of the multi-gate IGBT 200 is defined as a fifth distance d5. The fifth distance d5 is preferably, for example, 50 μm or more and 500 μm or less. When the fifth distance d5 is 50 μm or more, for example, a breakdown voltage between the second gate electrode 204 and the emitter electrode 202 can be easily secured. When the fifth distance d5 is 500 μm or less, for example, the multi-gate IGBT 200 can be easily downsized.

A distance between the fourth conductor 121 and the second conductor 110 is defined as a sixth distance d6. The sixth distance d6 is preferably, for example, 50 μm or more and 1000 μm or less. When the sixth distance d6 is 50 μm or more, for example, a breakdown voltage between the fourth conductor 121 and the second conductor 110 can be easily secured.

Fourth Embodiment

Figure 5A:
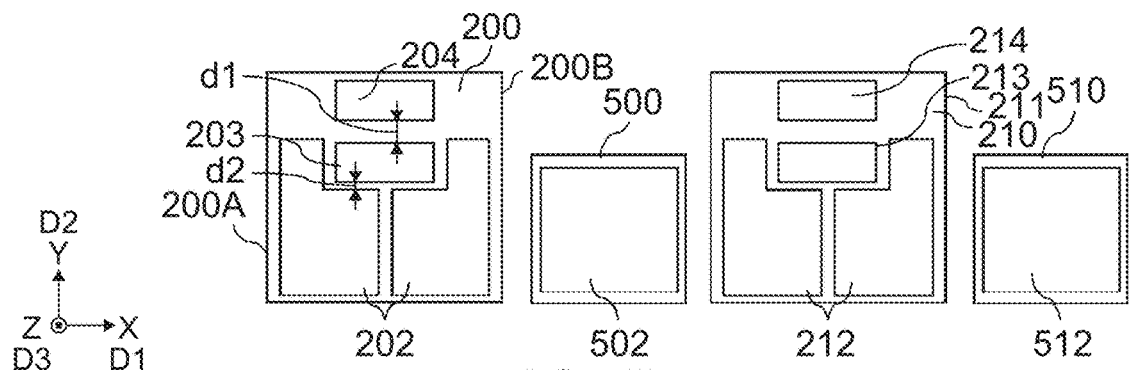
FIGS. 5A and 5B are schematic views illustrating a multi-gate IGBT, a diode, and a conductor included in a semiconductor module according to a fourth embodiment.
Figure 5B:
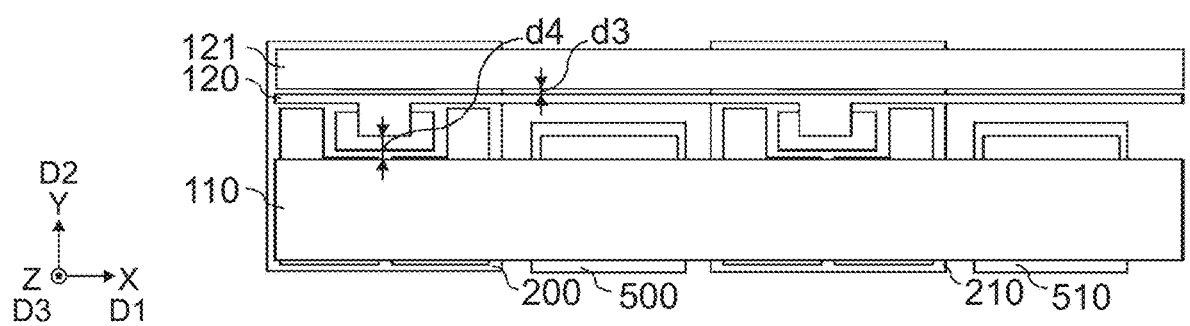

A fourth embodiment relates to an electrode arrangement of a multi-gate IGBT and a method for connecting the multi-gate IGBT and a conductor. FIGS. 5A and 5B are schematic views illustrating a multi-gate IGBT, a diode, and a conductor included in a semiconductor module according to the first embodiment. FIG. 5A is a plan view illustrating the multi-gate IGBT and the diode according to the fourth embodiment, and FIG. 5B is a plan view illustrating a positional relationship between the multi-gate IGBT and the diode, and the conductor according to the fourth embodiment.

As illustrated in FIG. 5A, a part of the first gate electrode 203 of the multi-gate IGBT 200 is surrounded by the emitter electrode 202 in the fourth embodiment. Further, a part of the first gate electrode 213 of the multi-gate IGBT 210 is surrounded by the emitter electrode 212. In the first direction, each of the first gate electrodes 203 and 213 are located between a part and another part of each of the emitter electrodes 202 and 212. In such a case as well, the second conductor 110, the third conductor 120, and the fourth conductor 121 are electrically separated while being present at the same height by wiring the third conductor 120 so as to pass between the first gate electrode 203 and the second gate electrode 204 as illustrated in FIG. 5B. Further, the first gate electrode 203 and the second gate electrode 204 of the multi-gate IGBT 200 may be displaced in the first direction D1 as in the second embodiment, and the first gate electrode 213 and the second gate electrode 214 of the multi-gate IGBT 210 may also be displaced in the first direction D1 as in the second embodiment. The third conductor 120 has a portion extending in the second direction D2, and is in contact with the first gate electrode at the portion, so that a contact area can be increased while making a portion extending in the first direction D1 narrow. Since the portion extending in the first direction D1 is narrow, the first distance d1 can be reduced. The first distance d1 is preferably, for example, 5000 μm or less.

In the fourth embodiment, the first distance d1 is preferably, for example, 500 μm or more. When the first distance d1 is 500 μm or more, for example, the conductor 120 can be easily wired between the first gate electrode 203 and the second gate electrode 204.

Fifth Embodiment

Figure 6A:
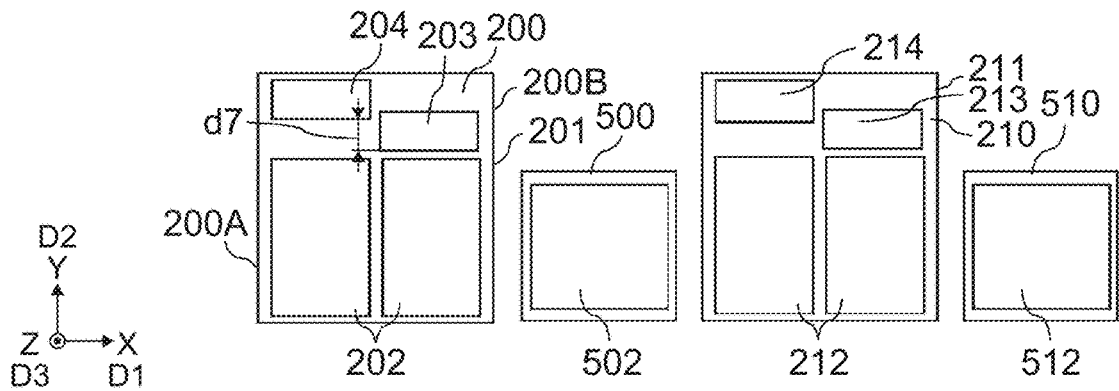
FIGS. 6A and 6B are schematic views illustrating a multi-gate IGBT, a diode, and a conductor included in a semiconductor module according to a fifth embodiment.
Figure 6B:
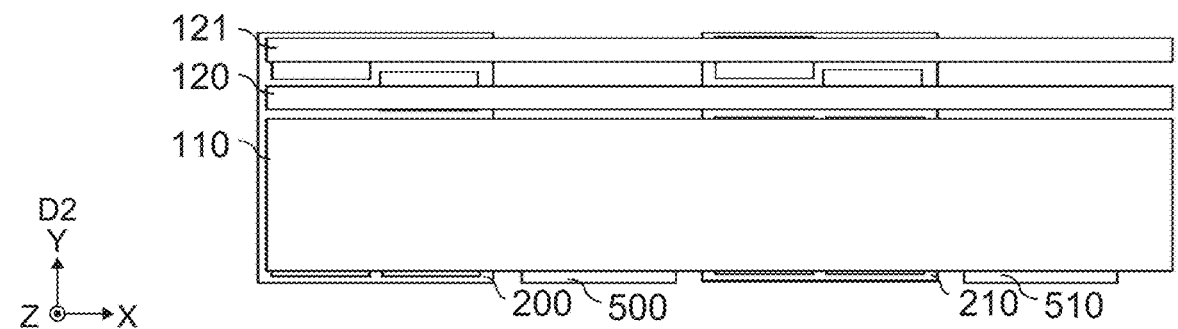

A fifth embodiment relates to an electrode arrangement of a multi-gate IGBT and a method for connecting the multi-gate IGBT and a conductor. FIGS. 6A and 6B are schematic views illustrating a multi-gate IGBT, a diode, and a conductor included in a semiconductor module according to the first embodiment. FIG. 6A is a plan view illustrating the multi-gate IGBT and the diode according to the fifth embodiment, and FIG. 6B is a plan view illustrating a positional relationship between the multi-gate IGBT and the diode, and the conductor according to the fifth embodiment.

As illustrated in FIG. 6A, a part of the first gate electrode 203 and a part of the second gate electrode 204 of the multi-gate IGBT 200 have the same D2 coordinate in the fifth embodiment. A position of a part of the first gate electrode 203 and a position of a part of the second gate electrode 204 are the same in the second direction D2. Further, a part of the first gate electrode 213 and a part of the second gate electrode 214 of the multi-gate IGBT 210 have the same D2 coordinate. In such a case as well, the second conductor 110, the third conductor 120, and the fourth conductor 121 are electrically separated while being present at the same height since the third conductor 120 is wired so as not to be present directly above the second gate electrodes 204 and 214, the fourth conductor 121 is wired so as not to be present directly above the first gate electrodes 203 and 213 as illustrated in FIG. 6B. In the second direction, the third conductor 120 is located between the second gate electrodes 204 and 214 and the emitter electrodes 202 and 212. Further, the first gate electrode 203 and the second gate electrode 204 of the multi-gate IGBT 200 may be displaced in the first direction D1 as in the second embodiment, and the first gate electrode 213 and the second gate electrode 214 of the multi-gate IGBT 210 may also be displaced in the first direction D1 as in the second embodiment. The first gate electrode 203 and the second gate electrode 204 can be formed to be large since a part of the first gate electrode 203 and a part of the second gate electrode 204 are arranged to overlap each other in the second direction.

A distance between a lower end of the first gate electrode 203 and a lower end of the second gate electrode 204 of the multi-gate IGBT 200 is defined as a seventh distance d7. A distance between an emitter-electrode-side end of the first gate electrode and an emitter-electrode-side end of the second gate electrode is a seventh distance d7. The seventh distance d7 is preferably, for example, 500 μm or more. When the seventh distance d7 is 500 μm or more, for example, the conductor 120 can be easily wired between the second gate electrode 204 and the emitter electrode 202.

Sixth Embodiment

Figure 7A:
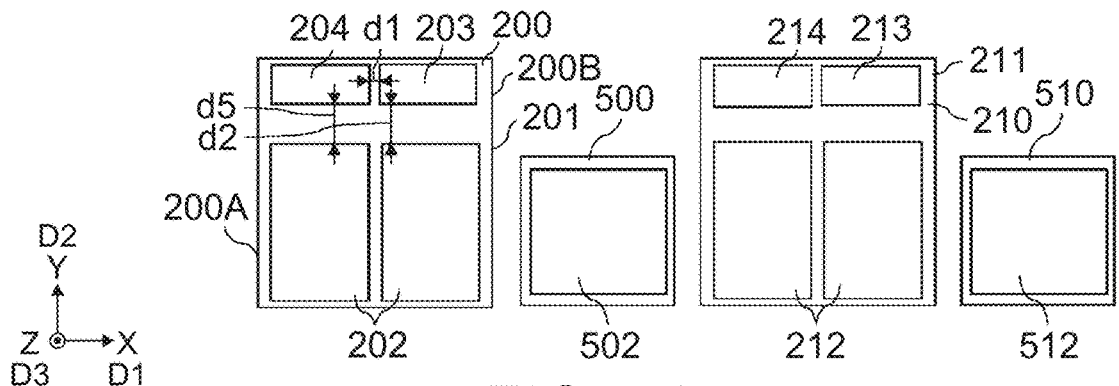
FIGS. 7A and 7B are schematic views illustrating a multi-gate IGBT, a diode, and a conductor included in a semiconductor module according to a sixth embodiment.
Figure 7B:
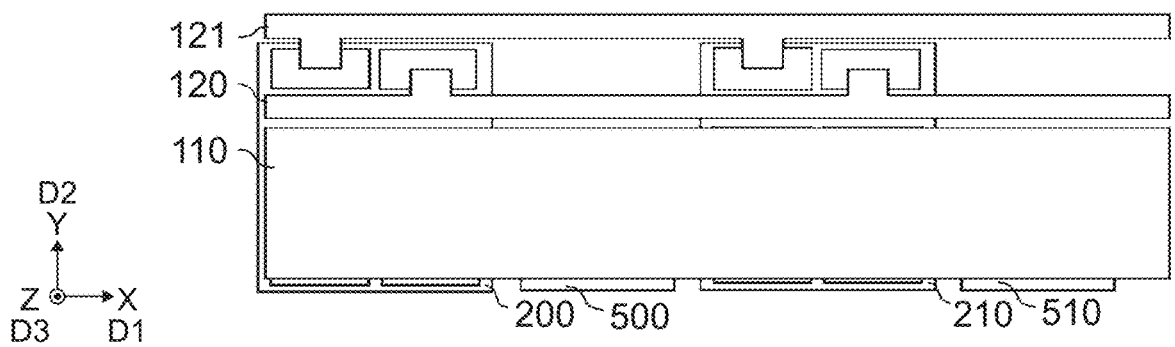

A sixth embodiment relates to an electrode arrangement of a multi-gate IGBT and a method for connecting the multi-gate IGBT and a conductor. FIGS. 7A and 7B are schematic views illustrating a multi-gate IGBT, a diode, and a conductor included in a semiconductor module according to the first embodiment. FIG. 7A is a plan view illustrating the multi-gate IGBT and the diode according to the sixth embodiment, and FIG. 7B is a plan view illustrating a positional relationship between the multi-gate IGBT and the diode, and the conductor according to the sixth embodiment.

In the sixth embodiment, the first gate electrode 203 and the second gate electrode 204 of the multi-gate IGBT 200 are arranged side by side at an interval only in the first direction D1, and the first gate electrode 203 and the second gate electrode 204 are arranged side by side to be spaced apart from the emitter electrode 202 in the second direction as illustrated in FIG. 7A. Further, the first gate electrode 213 and the second gate electrode 214 of the multi-gate IGBT 210 are arranged side by side at an interval only in the first direction D1, and the first gate electrode 213 and the second gate electrode 214 are arranged side by side to be spaced apart from the emitter electrode 212 in the second direction D2. In such a case as well, the second conductor 110, the third conductor 120, and the fourth conductor 121 are electrically separated while being present at the same height since the third conductor 120 is wired so as to pass between the first gate electrodes 203 and 213 and the second gate electrodes 204 and 214, and the emitter electrodes 202 and 212, and the fourth conductor 121 is wired on a terminal side (end side) as viewed from the first gate electrodes 203 and 213 and the second gate electrodes 204 and 214 as illustrated in FIG. 7B. Further, the first gate electrode 203 and the second gate electrode 204 of the multi-gate IGBT 200 may be displaced in the first direction D1 as in the second embodiment, and the first gate electrode 213 and the second gate electrode 214 of the multi-gate IGBT 210 may also be displaced in the first direction D1 as in the second embodiment.

In the sixth embodiment, the second distance d2 and the fifth distance d5 are preferably, for example, 500 μm or more. When the second distance d2 and the fifth distance d5 are 500 μm or more, for example, the conductor 120 can be easily wired between the first gate electrode 203 and the second gate electrode 204, and the emitter electrode 202.

Although the case where one multi-gate IGBT includes the first gate electrode and the second gate electrode has been described in the above examples, one embodiment or a combination of a plurality of embodiments can be applied to a case where a multi-gate IGBT includes any number of two or more gate electrodes of a first gate electrode, a second gate electrode, a third gate electrode, . . . , and an N-th gate electrode.

The embodiments may include the following configuration (for example, technical ideas).

(Configuration 1) A semiconductor module including: a first conductor extending in a first direction and a second direction intersecting the first direction; a second conductor extending in the first direction and located away from the first conductor in a third direction intersecting the first direction and the second direction; a third conductor extending in the first direction and located at the same position as the second conductor in the third direction; a fourth conductor extending in the first direction and located at the same position as the second conductor in the third direction; a plurality of conductive bonding materials; and a plurality of multi-gate semiconductor devices, the multi-gate semiconductor device including: a semiconductor layer having a first plane and a second plane; a collector electrode located on the first plane and bonded to the first conductor via a conductive bonding material; an emitter electrode located on the second plane and bonded to the second conductor via a conductive bonding material; a first gate electrode located on the second plane, located away from the emitter electrode in the second direction, and bonded to the third conductor via a conductive bonding material; and a second gate electrode located on the second plane, located away from the emitter electrode in the second direction, and bonded to the fourth conductor via a conductive bonding material.

(Configuration 2) The semiconductor module according to Configuration 1, in which the first gate electrode and the second gate electrode are located at an interval in the second direction.

(Configuration 3) The semiconductor module according to Configuration 1 or 2, in which a first distance between the first gate electrode and the second gate electrode is 50 μm or more and 500 μm or less, a second distance between the first gate electrode and the emitter electrode is 50 μm or more and 500 μm or less, a third distance between the third conductor and the fourth conductor is 50 μm or more, and a fourth distance between the second conductor and the third conductor is 50 μm or more.

(Configuration 4) The semiconductor module according to Configuration 1, in which the emitter electrode is located between the first gate electrode and the second gate electrode in the second direction.

(Configuration 5) The semiconductor module according to Configuration 1 or 4, in which a second distance between the first gate electrode and the emitter electrode is 50 μm or more and 500 μm or less, a fifth distance between the second gate electrode and the emitter electrode is 50 μm or more and 500 μm or less, a fourth distance between the second conductor and the third conductor is 50 μm or more, and a sixth distance between the second conductor and the fourth conductor is 50 μm or more.

(Configuration 6) The semiconductor module according to Configuration 1, in which a part of the first gate electrode is located between a part and another part of the emitter electrode in the first direction, and the third conductor is located between the first gate electrode and the second gate electrode in the second direction.

(Configuration 7) The semiconductor module according to Configuration 1, in which a position of a part of the first gate electrode and a position of a part of the second gate electrode are identical in the second direction, and the third conductor is located between the second gate electrode and the emitter electrode in the second direction.

(Configuration 8) The semiconductor module according to Configuration 1, in which a seventh distance between an end of the first gate electrode on a side close to the emitter electrode and an end of the second gate electrode on a side close to the emitter electrode is 500 μm or more.

(Configuration 9) The semiconductor module according to Configuration 1, in which the first gate electrode and the second gate electrode are arranged side by side at an interval in the first direction, and located at the same position in the second direction, and the third conductor is located between the first and second gate electrodes and the emitter electrode in the second direction.

(Configuration 10) The semiconductor module according to Configuration 9, in which a first distance between the first gate electrode and the second gate electrode is 50 µm or more and 500 µm or less, a second distance between the first gate electrode and the emitter electrode is 50 µm or more and 500 µm or less, a third distance between the third conductor and the fourth conductor is 50 µm or more, and a fourth distance between the second conductor and the third conductor is 50 µm or more.

(Configuration 11) The semiconductor module according to Configuration 1, in which the multi-gate semiconductor device includes: a first semiconductor region of a first conductivity type located between the collector electrode and the emitter electrode; a second semiconductor region of a second conductivity type located between the first semiconductor region and the emitter electrode; a third semiconductor region of the first conductivity type located between the second semiconductor region and the emitter electrode and in contact with the emitter electrode; a fourth semiconductor region of the second conductivity type located between the first semiconductor region and the emitter electrode; a fifth semiconductor region of the first conductivity type located between the second semiconductor region and the emitter electrode and in contact with the emitter electrode; a first gate conductor opposed to the second semiconductor region and the third semiconductor region via an insulating film and connected to the first gate electrode; and a second gate conductor opposed to the fourth semiconductor region and the fifth semiconductor region via an insulating film and connected to the second gate electrode.

(Configuration 12) The semiconductor module according to Configuration 11, in which the multi-gate semiconductor device includes a sixth semiconductor region of the second conductivity type located between the collector electrode and the first semiconductor.

(Configuration 13) The semiconductor module according to Configuration 1, in which the multi-gate semiconductor device is an IGBT.

(Configuration 14) A semiconductor module including: a plurality of switching elements each including a first plane and a second plane, which extend in a first direction and a second direction intersecting the first direction, a collector electrode located on the first plane and connected to a first conductive plate, an emitter electrode located on the second plane, a first gate electrode located on the second plane, and a second gate electrode located on the second plane; a plurality of conductive bonding materials respectively connected to a plurality of the emitter electrodes, a plurality of the first gate electrodes, and a plurality of third gate electrodes; the first conductive plate extending in the first direction and electrically connected to a plurality of the collector electrodes of the plurality of switching elements; a second conductive plate extending in the first direction and electrically connected to the plurality of emitter electrodes of the plurality of switching elements via the plurality of conductive bonding materials; a third conductive plate extending in the first direction and electrically connected to the plurality of first gate electrodes of the plurality of switching elements via the plurality of conductive bonding materials; and a conductive fourth conductive plate extending in the first direction and electrically connected to a plurality of the second gate electrodes of the plurality of switching elements via the plurality of bonding materials.

According to the embodiments, it is possible to provide a semiconductor module which enable a plurality of multi-gate IGBTs that suppress loss to be mounted on both surfaces including a gate portion.

The embodiments of the present invention have been described above with reference to specific examples. However, the present invention is not limited to these specific examples. For example, specific configurations of the respective elements such as a semiconductor device, a metal bonding material, a conductor, a heat dissipation fin, and a control unit included in a semiconductor module are included in the range of the present invention as long as a person skilled in the art can similarly carry out the present invention by appropriately selecting the elements from known ranges and obtain the same effects.

Further, a combination of any two or more elements of the respective specific examples within a technically possible range is also included in the range of the present invention as long as the gist of the present invention is included.

In addition, all semiconductor modules that can be implemented by those skilled in the art by appropriately changing the design on the basis of the semiconductor modules described above as the embodiments of the present invention also fall within the range of the present invention as long as the gist of the present invention is included.

In addition, those skilled in the art can conceive various modified examples and corrected examples within the category of ideas of the present invention, and these modified examples and corrected examples are also understood to fall within the range of the present invention.

Although several embodiments of the invention have been described, these embodiments are provided as examples, and are not intended to limit the range of the invention. These novel embodiments can be implemented in a variety of other forms, and various omissions, substitutions and changes thereof may be made within a range not departing from a gist of the invention. These embodiments or modifications thereof fall within the range and gist of the invention, and are included in inventions described in the accompanying claims and their equivalents.

What is claimed is:

1. A semiconductor module comprising:
   a first conductor extending in a first direction and a second direction intersecting the first direction;
   a second conductor extending in the first direction and located away from the first conductor in a third direction intersecting the first direction and the second direction;
   a third conductor extending in the first direction and located at a same position as the second conductor in the third direction;
   a fourth conductor extending in the first direction and located at a same position as the second conductor in the third direction;
   a plurality of conductive bonding materials; and
   a plurality of multi-gate semiconductor devices,
   wherein the multi-gate semiconductor device comprises:

a semiconductor layer having a first plane and a second plane;
a collector electrode located on the first plane and bonded to the first conductor via a conductive bonding material;
an emitter electrode located on the second plane and bonded to the second conductor via a conductive bonding material;
a first gate electrode located on the second plane, located away from the emitter electrode in the second direction, and bonded to the third conductor via a conductive bonding material; and
a second gate electrode located on the second plane, located away from the emitter electrode in the second direction, and bonded to the fourth conductor via a conductive bonding material
wherein the first gate electrode and the second gate electrode are located at an interval in the second direction, and
a first distance between the first gate electrode and the second gate electrode is 50 μm or more and 500 μm or less, a second distance between the first gate electrode and the emitter electrode is 50 μm or more and 500 μm or less, a third distance between the third conductor and the fourth conductor is 50 μm or more, and a fourth distance between the second conductor and the third conductor is 50 μm or more.

2. The semiconductor module according to claim 1, wherein the multi-gate semiconductor device comprises:
a first semiconductor region of a first conductivity type located between the collector electrode and the emitter electrode;
a second semiconductor region of a second conductivity type located between the first semiconductor region and the emitter electrode;
a third semiconductor region of the first conductivity type located between the second semiconductor region and the emitter electrode and in contact with the emitter electrode;
a fourth semiconductor region of the second conductivity type located between the first semiconductor region and the emitter electrode;
a fifth semiconductor region of the first conductivity type located between the second semiconductor region and the emitter electrode and in contact with the emitter electrode;
a first gate conductor opposed to the second semiconductor region and the third semiconductor region via an insulating film and connected to the first gate electrode; and
a second gate conductor opposed to the fourth semiconductor region and the fifth semiconductor region via an insulating film and connected to the second gate electrode.

3. The semiconductor module according to claim 2, wherein the multi-gate semiconductor device comprises a sixth semiconductor region of the second conductivity type located between the collector electrode and the first semiconductor region.

4. The semiconductor module according to claim 1, wherein the multi-gate semiconductor device is an IGBT.

5. A semiconductor module comprising:
a plurality of switching elements each including a first plane and a second plane, which extend in a first direction and a second direction intersecting the first direction, a collector electrode located on the first plane and connected to a first conductive plate, an emitter electrode located on the second plane, a first gate electrode located on the second plane, and a second gate electrode located on the second plane;
a plurality of conductive bonding materials respectively connected to a plurality of the emitter electrodes, a plurality of the first gate electrodes, and a plurality of the second gate electrodes;
the first conductive plate extending in the first direction and electrically connected to a plurality of the collector electrodes of the plurality of switching elements;
a second conductive plate extending in the first direction and electrically connected to the plurality of emitter electrodes of the plurality of switching elements via the plurality of conductive bonding materials;
a third conductive plate extending in the first direction and electrically connected to the plurality of first gate electrodes of the plurality of switching elements via the plurality of conductive bonding materials; and
a conductive fourth conductive plate extending in the first direction and electrically connected to a plurality of the second gate electrodes of the plurality of switching elements via the plurality of bonding materials
wherein the first gate electrode and the second gate electrode are located at an interval in the second direction, and
a first distance between the first gate electrode and the second gate electrode is 50 μm or more and 500 μm or less, a second distance between the first gate electrode and the emitter electrode is 50 μm or more and 500 μm or less, a third distance between the third conductive plate and the fourth conductive plate is 50 μm or more, and a fourth distance between the second conductive plate and the third conductive plate is 50 μm or more.

6. The semiconductor module according to claim 5, wherein the switching elements comprise:
a first semiconductor region of a first conductivity type located between the collector electrode and the emitter electrode;
a second semiconductor region of a second conductivity type located between the first semiconductor region and the emitter electrode;
a third semiconductor region of the first conductivity type located between the second semiconductor region and the emitter electrode and in contact with the emitter electrode;
a fourth semiconductor region of the second conductivity type located between the first semiconductor region and the emitter electrode;
a fifth semiconductor region of the first conductivity type located between the second semiconductor region and the emitter electrode and in contact with the emitter electrode;
a first gate conductor opposed to the second semiconductor region and the third semiconductor region via an insulating film and connected to the first gate electrode; and
a second gate conductor opposed to the fourth semiconductor region and the fifth semiconductor region via an insulating film and connected to the second gate electrode.

7. The semiconductor module according to claim 6, wherein the switching elements comprise a sixth semiconductor region of the second conductivity type located between the collector electrode and the first semiconductor region.

8. The semiconductor module according to claim 5, wherein the switching elements include an IGBT.

* * * * *